(12) United States Patent
McLaughlin, II

(10) Patent No.: US 11,131,703 B2
(45) Date of Patent: Sep. 28, 2021

(54) APPARATUS COMPRISING A SEMICONDUCTOR-BASED PHOTOMULTIPLIER AND METHOD REGARDING GAIN STABILIZATION

(71) Applicant: SAINT-GOBAIN CERAMICS & PLASTICS, INC., Worcester, MA (US)

(72) Inventor: Michael Terrance McLaughlin, II, Lyndhurst, OH (US)

(73) Assignee: SAINT-GOBAIN CERAMICS & PLASTICS, INC., Worcester, MA (US)

( * ) Notice: Subject to any disclaimer, the term of this patent is extended or adjusted under 35 U.S.C. 154(b) by 4 days.

(21) Appl. No.: 16/877,768

(22) Filed: May 19, 2020

(65) Prior Publication Data

US 2020/0278387 A1    Sep. 3, 2020

Related U.S. Application Data

(63) Continuation of application No. 16/182,997, filed on Nov. 7, 2018, now Pat. No. 10,690,714.

(Continued)

(51) Int. Cl.
*G01R 31/26*   (2020.01)
*G01J 1/44*    (2006.01)
*H01L 31/02*   (2006.01)

(52) U.S. Cl.
CPC ............ *G01R 31/2635* (2013.01); *G01J 1/44* (2013.01); *G01R 31/26* (2013.01);
(Continued)

(58) Field of Classification Search
CPC ............ G01R 31/2635; G01R 31/26; H01L 31/02027; G01J 1/44; G01J 2001/4466;
(Continued)

(56) References Cited

U.S. PATENT DOCUMENTS 6,362,472 B1 *  3/2002  Yarnall .................. G01T 1/161
                                                        250/252.1
6,548,821 B1    4/2003  Treves et al.
(Continued)

FOREIGN PATENT DOCUMENTS

JP    2003298101 A    10/2003
JP    2005283327 A    10/2005

OTHER PUBLICATIONS

Cvach et al., "Gain Stabilization of SiPMs1," Presented at International Workshop on Future Linear Colliders in 2013, published 2014, 11 pages.

(Continued)

*Primary Examiner* — Seung C Sohn
(74) *Attorney, Agent, or Firm* — Abel Schillinger, LLP; Robert N. Young

(57) ABSTRACT

Apparatuses and methods as described herein can be used to help stabilize the gain of a semiconductor-based photomultiplier. In an embodiment, an apparatus can include a semiconductor-based photomultiplier. The apparatus can be configured to inject a first input pulse into the semiconductor-based photomultiplier; determine a revised bias voltage for the semiconductor-based photomultiplier based at least in part on a first output pulse corresponding to the first input pulse and a second output pulse from the semiconductor-based photomultiplier that is obtained at another time as compared to the first output pulse; and adjust a bias voltage for the semiconductor-based photomultiplier to the revised bias voltage. A calibration light source, a temperature sensor, and temperature information are not required to be used for the method.

20 Claims, 3 Drawing Sheets

Related U.S. Application Data

(60) Provisional application No. 62/585,039, filed on Nov. 13, 2017.

(52) U.S. Cl.
CPC .. H01L 31/02027 (2013.01); *G01J 2001/442* (2013.01); *G01J 2001/4466* (2013.01)

(58) Field of Classification Search
CPC ................... G01J 2001/442; G01J 1/58; G01J 2001/4406; G01J 2001/444
See application file for complete search history.

(56) References Cited

U.S. PATENT DOCUMENTS

| | | | |
|---|---|---|---|
| 8,222,589 | B2 | 7/2012 | Wang |
| 8,957,385 | B2 | 2/2015 | Frank et al. |
| 10,031,242 | B1 | 7/2018 | Farsoni et al. |
| 2013/0313414 | A1 | 11/2013 | Pavlov et al. |
| 2013/0334411 | A1 | 12/2013 | Brunel et al. |
| 2014/0184197 | A1 | 7/2014 | Dolinsky |
| 2015/0177394 | A1* | 6/2015 | Dolinsky ............... G01T 7/005 250/252.1 |
| 2017/0059722 | A1 | 3/2017 | Stein |
| 2017/0192112 | A1 | 7/2017 | Sandvik et al. |
| 2017/0322324 | A1 | 11/2017 | Fu et al. |

OTHER PUBLICATIONS

Eigen et al., "SiPM Gain Stabilization Studies for Adaptive Power Supply," Presented at International Workshop on Future Linear Colliders in 2015, published 2016, 14 pages.

Licciulli et al., "A Novel Technique for the Stabilization of SiPM Gain Against Temperature Variations," IEEE Transactions on Nuclear Science, vol. 60, No. 2, 2013, pp. 606-611.

International Search Report and Written Opinion for PCT/US2018/059587, dated Mar. 4, 2019, 13 pages.

* cited by examiner

APPARATUS COMPRISING A SEMICONDUCTOR-BASED PHOTOMULTIPLIER AND METHOD REGARDING GAIN STABILIZATION

CROSS-REFERENCE TO RELATED APPLICATION

This application is a continuation of and claims priority to U.S. patent application Ser. No. 16/182,997, entitled "APPARATUS COMPRISING A SEMICONDUCTOR-BASED PHOTOMULTIPLIER AND METHOD REGARDING GAIN STABILIZATION," by Michael Terrance McLaughlin II, filed Nov. 7, 2018, which claims priority under 35 U.S.C. § 119(e) to U.S. Provisional Application No. 62/585,039, entitled "APPARATUS COMPRISING A SEMICONDUCTOR-BASED PHOTOMULTIPLIER AND METHOD REGARDING GAIN STABILIZATION," by Michael Terrance McLaughlin II, filed Nov. 13, 2017, all of which are assigned to the current assignee hereof and are incorporated herein by reference in their entireties.

FIELD OF THE DISCLOSURE

The present disclosure is directed to apparatuses comprising semiconductor-based photomultipliers and methods regarding gain stabilization.

RELATED ART

An apparatus can include a semiconductor-based photomultiplier, such as a Si photomultiplier. In use, the Si photomultiplier may need its gain adjusted, particularly when the temperature of the Si photomultiplier changes. A temperature sensor may be located near a Si photomultiplier, and a reading from the temperature sensor can be used to adjust the gain of the Si photomultiplier. Further improvements with apparatuses including semiconductor-based photomultipliers are desired.

BRIEF DESCRIPTION OF THE DRAWINGS

Embodiments are illustrated by way of example and are not limited in the accompanying figures.

Figure 1:
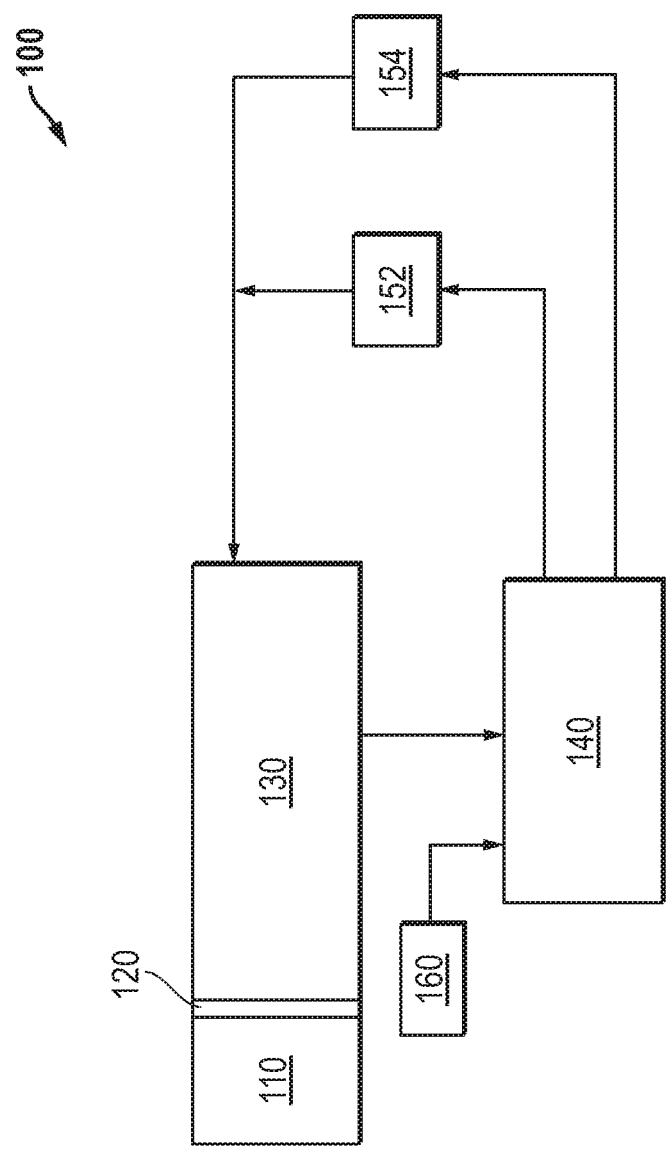
FIG. 1 includes a depiction of an apparatus in accordance with an embodiment.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

The term "compound semiconductor" intended to mean a semiconductor material that includes at least two different elements. Examples include SiC, SiGe, GaN, InP, $Al_xGa_{(1-x)}N$ where $0 \le x < 1$, CdTe, and the like. A III-V semiconductor material is intended to mean a semiconductor material that includes at least one trivalent metal element and at least one Group 15 element. A III-N semiconductor material is intended to mean a semiconductor material that includes at least one trivalent metal element and nitrogen. A Group 13-Group 15 semiconductor material is intended to mean a semiconductor material that includes at least one Group 13 element and at least one Group 15 element. A II-VI semiconductor material is intended to mean a semiconductor material that includes at least one divalent metal element and at least one Group 16 element.

The term "avalanche photodiode" refers to a single photodiode having a light-receiving area of at least 1 $mm^2$ and is operated in a proportional mode.

The term "SiPM" is intended to mean a photomultiplier that includes a plurality of photodiodes, wherein each of the photodiodes have a cell size less than 1 $mm^2$, and the photodiodes are operated in Geiger mode. The semiconductor material for the diodes in the SiPM can include silicon, a compound semiconductor, or another semiconductor material.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

The use of the word "about", "approximately", or "substantially" is intended to mean that a value of a parameter is close to a stated value or position. However, minor differences may prevent the values or positions from being exactly as stated. Thus, differences of up to ten percent (10%) (and up to twenty percent (20%) for semiconductor doping concentrations) for the value are reasonable differences from the ideal goal of exactly as described.

Group numbers corresponding to columns within the Periodic Table of Elements based on the IUPAC Periodic Table of Elements, version dated Nov. 28, 2016.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the scintillation, radiation detection and ranging arts.

Apparatuses and methods as described herein can be used to help stabilize the gain of a semiconductor-based photomultiplier. As the gain is stabilized, electronic pulses from the semiconductor-based photomultiplier or corresponding digital signals do not need to be adjusted to account for temperature changes of the semiconductor-based photomultiplier during operation of the apparatus. A calibration light source, a temperature sensor, and temperature information are not required to be used for the method. Further, the method used to stabilize the gain can be performed as a background function (not visible to the user) while the apparatus is being used for one or more of its principal functions, such as radiation detection, imaging, ranging, or the like.

In an embodiment, an apparatus can include a semiconductor-based photomultiplier. The apparatus can be configured to inject a first input pulse into the semiconductor-based photomultiplier; determine a revised bias voltage for the semiconductor-based photomultiplier based at least in part on a first output pulse corresponding to the first input pulse and a second output pulse from the semiconductor-based photomultiplier that is obtained at another time as compared to the first output pulse; and adjust a bias voltage for the semiconductor-based photomultiplier to the revised bias voltage. Adjust the bias voltage can be performed such that a gain of the semiconductor-based photomultiplier is closer to a predetermined value, as compared to not adjusting the bias voltage.

Embodiments using gain stabilization concepts as described herein can be used in a variety of different apparatuses that use semiconductor-based photomultipliers. Such apparatuses can include radiation detection apparatuses, ranging apparatuses, and other suitable apparatuses. The former can include nuclear physics tools, medical imaging tools, well logging or well bore tools, or the like. Ranging tools can include Light Detection and Ranging ("LiDAR") tools, three-dimensional ("3D") imaging tools, or the like. The semiconductor-based photomultiplier is coupled to a light source that may be within the apparatus or outside of the apparatus. The light source can include a scintillator, a laser, a light emitting diode ("LED") (inorganic or organic), or another suitable light source. In the description below, the apparatus will be described with respect to a radiation detection apparatus to provide an exemplary embodiment. After reading this specification, skilled artisans will appreciate that many other apparatuses may be used without departing from the concepts as described herein.

FIG. 1 illustrates an embodiment of a radiation detection apparatus 100. The radiation detection apparatus 100 can be a medical imaging apparatus, a well logging apparatus, a security inspection apparatus, for military applications, or the like. The radiation detection apparatus 100 can include a light source 110, a semiconductor-based photomultiplier 130, and an optical coupler 120 that optically couples to the light source 110 or another luminescent material to the semiconductor-based photomultiplier 130. The semiconductor-based photomultiplier 130 is electrically coupled to a control module 140, a pulse injector circuit 152, and a bias voltage supply circuit 154. The control module 140 is coupled to the pulse injector circuit 152 and the bias voltage supply circuit 154. The control module 140 may also be coupled to another component within the apparatus, another apparatus (not illustrated), such as a computer, persistent memory, a display, a keyboard, or the like.

An optional temperature sensor 160 may be located adjacent to an interface between the light source 110 and the semiconductor-based photomultiplier 130. In particular embodiment, the temperature sensor 160 can be on the light source, on the semiconductor-based photomultiplier 130, or within the semiconductor-based photomultiplier (e.g., as a thermistor in an integrated circuit or on a circuit board). In another particular embodiment, the temperature sensor 160 may be at most 9 cm, at most 2 cm, or at most 0.9 cm from the light source 110, the semiconductor-based photomultiplier 130, or both. In another embodiment, the temperature sensor 160 may be within an integrated circuit within the control module 140. The method as described herein does not require temperature information. Thus, the temperature sensor 160 may be used for other reasons, for example, to account for light output from the light source 110 as the temperature of the light source 110 changes.

In FIG. 1, arrows illustrate principal directions in which signals flow. In another embodiment, one or more of the electrical couplings may be bidirectional.

The light source 110 can be a luminescent material, such as a scintillator, and include a halide, an oxide, or another suitable material that can emit ultraviolet or visible light in response to absorbing targeted radiation, such as gamma rays, neutrons, ionized radiation, or the like. The optical coupler 120 can include a window, a silicone or acrylic material, or another transparent material. If needed or desired, a wavelength shifter may be used to change the wavelength of the emitted light from the light source 110 to a different wavelength that allows for a higher quantum efficiency of the semiconductor-based photomultiplier 130. In another apparatus, such as a ranging or other apparatus, the light source can be a laser, an LED, or the like. In such an application, light may be emitted from a light source and reflected by an object outside the apparatus and received by the semiconductor-based photomultiplier 130. In another application, the light source may be external to the apparatus 100, and light from the light source can be received by the semiconductor-based photomultiplier 130. In such applications, the optical coupler 120 may not be used.

The apparatuses and methods are well suited when the semiconductor-based photomultiplier is a SiPM. Still, the apparatuses and methods described herein may be used with another semiconductor-based photomultiplier, such as an avalanche photodiode. A SiPM can have a gain that changes with a change in temperature. The apparatuses and processes as described in more detail below can be used to help stabilize the gain of a semiconductor-based photomultiplier, such as a SiPM.

The control module 140 can serve one or more different functions. When the apparatus is a radiation detection apparatus, the control module 140 can receive an electronic pulse from the semiconductor-based photomultiplier 130 and perform one or more functions. For example, the control module 140 may be configured to count radiation events, identify a radiation source, or the like. When used in a ranging application, the control module 140 can determine a distance between the semiconductor-based photomultiplier 130 and a radiation source, a light source, or an object that reflects light that is received by the semiconductor-based photomultiplier 130.

The control module 140 can also be configured to help stabilize the gain of the semiconductor-based photomultiplier 130. In a particular implementation, the control module 140 can be coupled to the pulse injection circuit 152, and the control module 140 can send control signals to the pulse injector circuit 152, which in turn can send a pulse to the semiconductor-based photomultiplier 130. The control module 140 can also be coupled to the bias voltage circuit 154, which in turn can set the bias voltage for the semiconductor-based photomultiplier 130. The bias voltage circuit 154 may supply a direct current voltage. A capacitor can be used to keep the voltage from the bias voltage circuit 154 from interfering with the operation of the pulse injection circuit 152. Such capacitor may be part of the pulse injection circuit 152 or may be located between the pulse injection circuit 152 and where the pulse integration circuit 152 connects to an input signal line to the semiconductor-based photomultiplier 130. The gain stabilization function is described in conjunction with a flow chart later in this specification.

Figure 2:
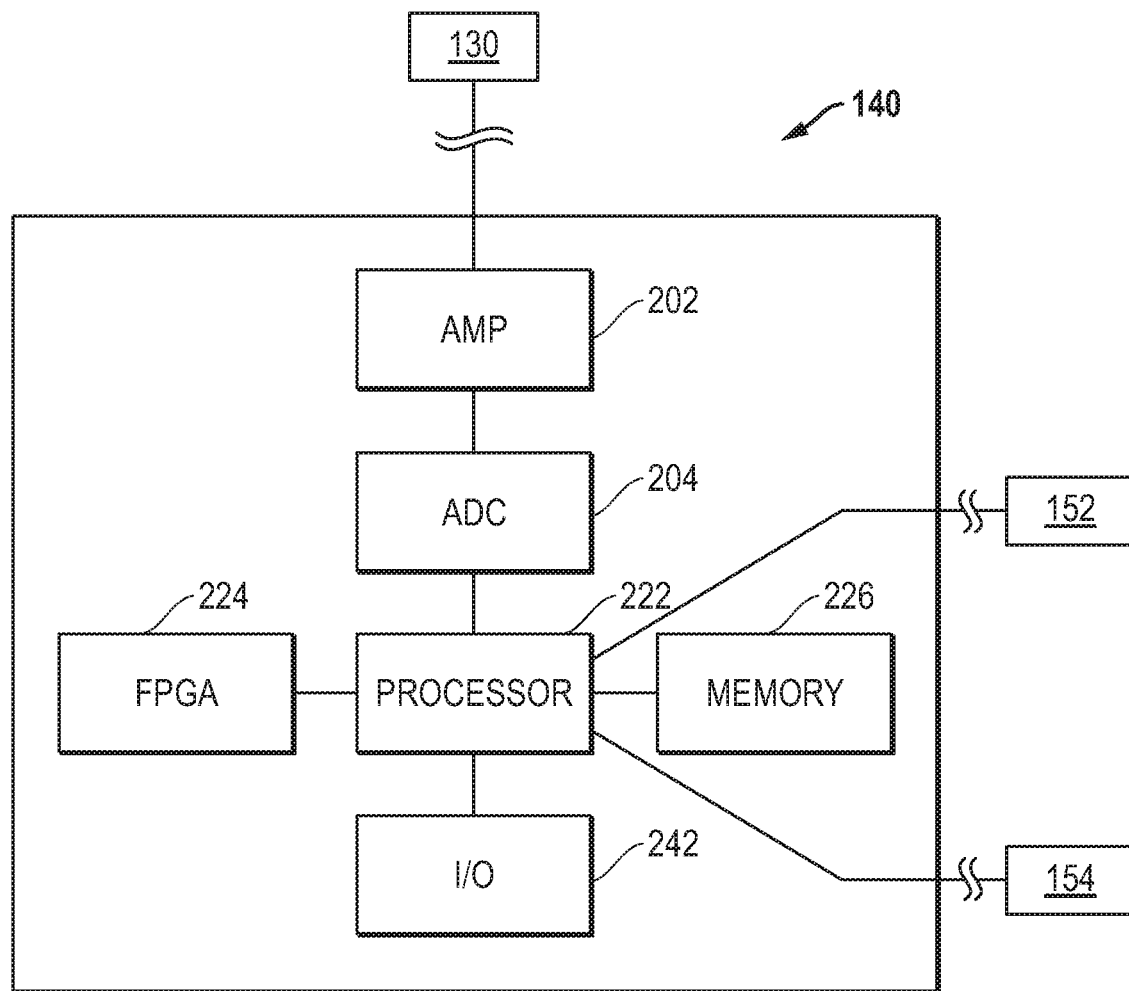
FIG. 2 includes a depiction of another portion of the apparatus in accordance with the embodiment.

FIG. 2 includes an illustration of components within the control module 140. The semiconductor-based photomultiplier 130 is coupled to an amplifier 202 within the control module 140. In an embodiment, the amplifier 202 can be a high fidelity amplifier. The amplifier 202 can amplify the electronic pulse, and the amplified electronic pulse can be converted to a digital signal at an analog-to-digital converter ("ADC") 204 that can be received by the processor 222. The processor 222 can be coupled to a programmable/re-programmable processing module ("PRPM"), such as a field programmable gate array ("FPGA") 224 or application-specific integrated circuit ("ASIC"), a memory 226, an input/output ("I/O") module 242, the pulse injection circuit 152, and the bias voltage circuit 154. The couplings may be unidirectional or bidirectional. In another embodiment, more, fewer, or different components can be used in the control module 140. For example, functions provided by the FPGA 224 may be performed by the processor 222, and thus, the FPGA 224 is not required. The FPGA 224 can act on information faster than the processor 222.

During operation, an electronic pulse from the semiconductor-based photomultiplier 130 can be received at the control module 140. The processor 222 can analyze the signal to determine if the signal corresponds to the functions for which the apparatus is used by the user, such as radiation detection, ranging, or the like or for a gain stabilization function. For example, for radiation detection, the processor 222 can analyze the digital signal from the ADC 204 and determine if the digital signal corresponds to a radiation event that reaches a peak and then has an exponential decay, or if the digital signal corresponds to a pulse injected from the pulse injection circuit 152 to the semiconductor-based photomultiplier 130. The pulse injected from the pulse injection circuit 152 will not have an exponential decay, as would be seen with a radiation event.

Some or all of the functions described with respect to the FPGA 224 may be performed by the processor 222, and therefore, the FPGA 224 is not required in all embodiments. Further, the FPGA 224, the memory 226, the I/O module 242, or any combination thereof may be within the same integrated circuit, such as the processor 222. In another embodiment, the control module 140 does not need to be housed within the apparatus 100. Still further, at least one component of the control module 140, as illustrated in FIG. 4, may be within the apparatus 100, and at least one other component may be outside the apparatus 100. The control module 140 within the apparatus 100 can allow operations to proceed quickly without having data transmission delays.

Optionally, before starting the method, the bias voltage can be set to a value to achieve a desired gain for a semiconductor-based photomultiplier 130. The processor 222 can send an instruction to the bias voltage circuit 154. The bias voltage control circuit 154 can supply a bias voltage to the semiconductor-based photomultiplier 130 to set the gain for the semiconductor-based photomultiplier. When the semiconductor-based photomultiplier 130 is a SiPM, the bias voltage may be within a few volts of an average breakdown voltage for the diodes in the SiPM. The bias voltage may be higher or lower than the average breakdown voltage. The breakdown voltage may depend on the semiconductor material of the diode, the dopant concentrations at n-p junctions, and the temperature of the semiconductor-based photomultiplier 130. In an embodiment, the bias voltage can be in a range of approximately 20 VDC to 30 VDC. The actual voltage used for the bias voltage may depend on where the apparatus 100 operates well, for example, to provide an acceptable signal-to-noise ratio. The bias voltage may be set initially at room temperature, such as in a range of 20° C. to 25° C. This initial setting of the bias voltage may be performed before the final installation of the apparatus 100. Thus, the initial setting may be performed at a test bench, at a factory, or before installation in the field is completed, or during a start-up sequence. In another embodiment, the bias voltage may be initially set as described with respect to the method below. During operation, the semiconductor-based photomultiplier can be at least 1.1° C., at least 5° C., or at least 11° C. away from the temperature used when initially setting the bias voltage.

If needed or desired, additional testing may be performed to generate temperature and corresponding bias voltage information in order to keep the gain of the semiconductor-based photomultiplier within a predetermined range, such as at most 9%, at most 5%, or at most 1% of the gain as initially set or reset. Such information may be stored in the FPGA 224 or the memory 226.

Figure 3:
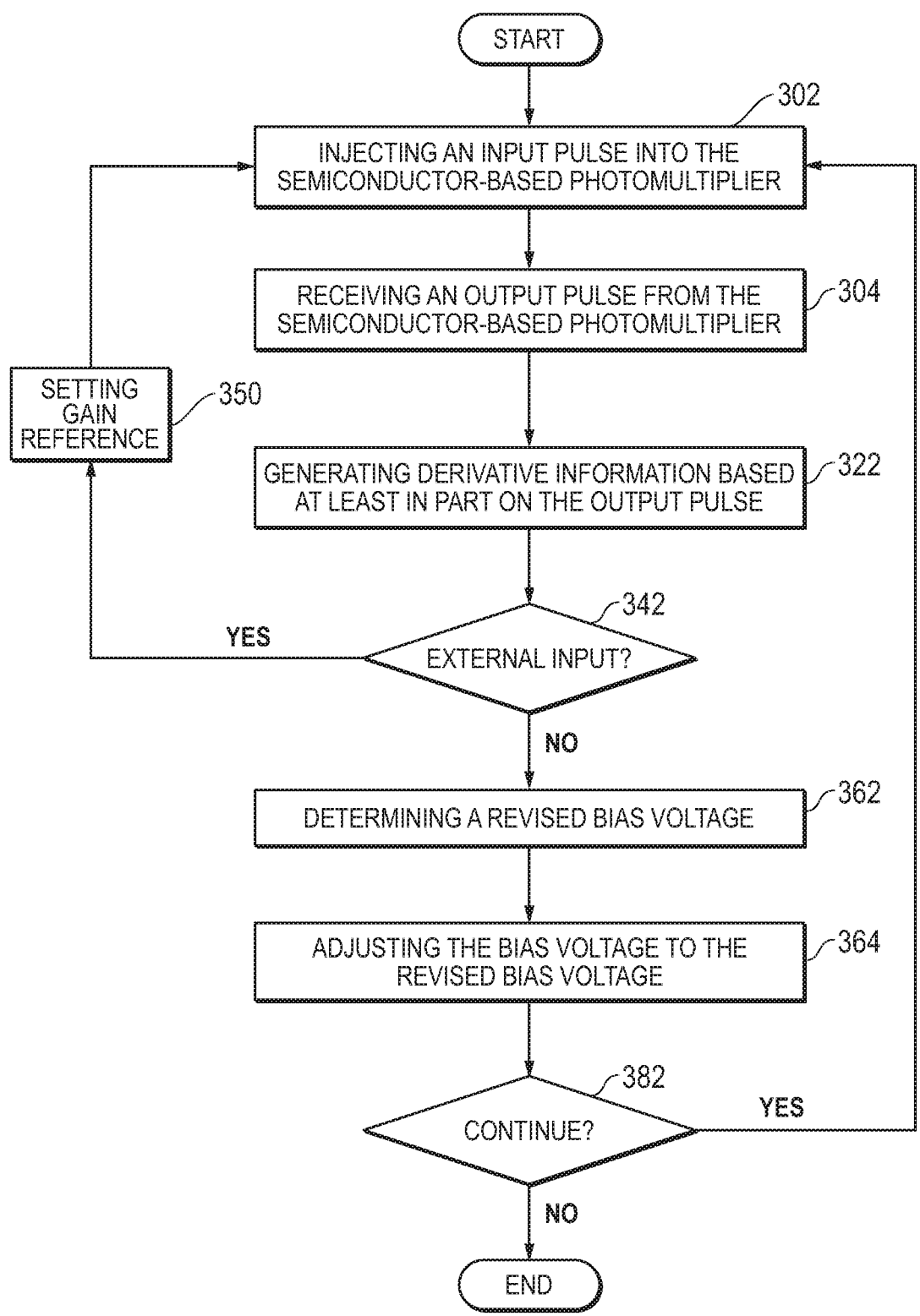
FIG. 3 includes a flow chart of a gain stabilization sequence in accordance with an embodiment.

The gain stabilization function is described during operation with respect to the flow chart as illustrated in FIG. 3 and portions of the apparatus 100 as illustrated in FIGS. 1 and 2. The method begins with injecting an input pulse into the semiconductor-based photomultiplier, at block 302. Referring to FIG. 1, the semiconductor-based photomultiplier 130 can be a SiPM. The processor 202 can send a signal to the pulse injection circuit 152, so that the pulse injection circuit 152 sends a pulse to the semiconductor-based photomultiplier 130. In an embodiment, the pulse is in the form of a voltage. Injecting the pulse can be performed on a predetermined schedule or in response to a predetermined event, such as a reboot or start-up following maintenance, a shutdown or power outage. In a particular embodiment, every fraction of a second, the magnitude of the pulse can be increased in steps (added to the bias voltage) until the input voltage to the semiconductor-based photomultiplier 130 is pushed above the breakdown threshold at the current operating temperature. The fraction of a second can be in a range of 2 ms to 500 ms, or in a range of 5 ms to 50 ms, and the stepped increase in voltage can be in a range of 2 mV to 500 mV, or in a range of 5 mV to 50 mV. When the semiconductor-based photomultiplier 130 is a SiPM, the breakdown threshold can be the average breakdown threshold, as the SiPM has many diodes that do not have the same breakdown voltage.

The method can include receiving an output pulse from the semiconductor-based photomultiplier, at block 304. The input pulse received by semiconductor-based photomultiplier 130 can result in the semiconductor-based photomultiplier 130 generating an output pulse in the form of an electronic pulse that is transmitted by the semiconductor-based photomultiplier 130 and received by the control module 140. The electronic pulse is amplified by the amplifier 202, converted to a digital signal by the ADC 204, and received by the processor 222.

The method can further include generating derivative information based at least in part on the output pulse from the semiconductor-based multiplier, at block 322. The processor 222 can analyze the digital signal and generate derivative information. Such derivative information can include whether a neutron or gamma radiation was absorbed by the light source 110, isotope identification, rise time, decay time, emission spectrum, pulse height resolution, or the like. When the apparatus is an imaging or ranging tool, derivative information can include how far a radiation source or an object is from the semiconductor-based photomultiplier 130. With respect to gain stabilization, the processor 222 can integrate the charge over time corresponding to the electronic pulse from the semiconductor-based photomultiplier 130.

A determination can be made whether or not an external input is received, at diamond 342. For example, a gain reference may not have been previously set, and the external input may be to set the gain reference. If the gain reference had not been previously set, it may be set at this time. In another embodiment, the performance of the apparatus 100 may have been characterized, and now the gain reference needs to be set. The method can proceed along the "YES" branch from the decision diamond 342, and the method can include setting the gate reference, at block 350. The method returns back to block 302 and continues.

Blocks 302, 304, and 322 are repeated, and the decision at decision diamond 342 is made. In an embodiment, the gain reference has been set and is not being reset, so the method proceeds along the "NO" branch from the decision diamond 342. The method further includes determining a revised bias voltage, at block 364. In a particular embodiment, the derivative information from block 322 can include the charge of the electronic pulse from the semiconductor-based photomultiplier 130 integrated over time. In a particular embedment, the revised bias voltage can be within 9%, within 5%, or within 1% of $V_{BR}$, wherein $$V_{B1}=V_{B2}+N*(S_2-S_1),$$

where $V_{B1}$ is a bias voltage corresponding to a current output pulse, $V_{B2}$ is a bias voltage corresponding to a prior output pulse, N is a conversion factor, $S_1$ is a first integrated signal corresponding to the current output pulse, and $S_2$ is a second integrated signal corresponding to a prior output pulse.

The first and second integrated signals can be a charge, a current, a voltage, analog signal, or a digitized version of analog signal. The conversion factor can be obtained by plotting data of bias voltages as a function of integrated signals corresponding to previously collected output pulses. Thus, the conversion factor can be based on historical data.

The method can include adjusting the bias voltage to the revised bias voltage, at block 364. The processor 222 can send a signal to the bias voltage circuit 154, and the bias voltage circuit 154 can adjust the bias voltage to the revised bias voltage. The revised bias voltage allows the semiconductor-based photomultiplier 130 to operate closer to the gain for the semiconductor-based photomultiplier 130 as it was set in block 350. Adjusting the bias voltage does not need to be performed every time an input pulse from the pulse inject circuit 152 is injected into the semiconductor-based photomultiplier 130. For example, a threshold value may be used for determining whether or not to adjust the bias voltage. In a particular embodiment, $V_{BR}$ may be less than 0.1% different from $V_{B2}$, and the bias voltage may not be adjusted.

After adjusting the bias voltage, a decision can be made whether to continue, at decision diamond 382. If "YES", the method continues with block 302. Otherwise ("NO" branch of decision diamond 382), the method can end.

During or after the method, other actions may occur. For example, a user can implement a more exotic control scheme. Alternatively, a user can manually adjust the bias voltage, set the gain reference, or perform another action. Further, data can be collected and stored in the memory 226, such as timestamp, integrated charge, bias voltage, or the like. The data can be reviewed to monitor or determine the health of the apparatus 100. The apparatus 100 can be configured to analyze a set of bias voltages to monitor or determine the health of the apparatus 100. For example, the changes in bias voltages as a function of time may be increasing. This may be a sign that the semiconductor-based photomultiplier 130 may be getting closer to failing or the apparatus 100 should be shut down soon for maintenance. For example, prior bias voltage may have been within a range of 1%, and a recent or set of bias voltages may be at least 2% greater than the prior adjustments. As another example, prior adjustments to the bias voltage may have had a standard deviation of 0.7%, and a recent or set of recent adjustments to the bias voltage may have a standard deviation of 1.1%. Statistically significant changes to the adjustments, the corresponding standard deviations, or both changes and standard deviations can be used. Thus, a proactive approach to maintaining the apparatus 100 can be used, rather than waiting for the failure to occur, which may happen at an inopportune time.

An advantage of the method is that it can run in the background (not readily apparent to the user) while one or more primary functions of the apparatus, such as detecting or identifying radiation, imaging, ranging, or the like are being used. The method can help to stabilize the gain in real time during the normal operation of the apparatus. Thus, the apparatus does not need to be shut down or put in an off-line state when using the method as previously described. In an embodiment, the method can be performed on a predetermined schedule or in response to an occurrence of a predetermined event, for example, after the apparatus has been turned on and warmed up.

The method can be performed without the need for a calibrating light source. Further the method can be performed without temperature information. Accordingly, a temperature sensor is not required.

However, the apparatus 100 can include a temperature sensor if needed or desired. The temperature sensor can provide temperature information that is used for other purposes. For example, the light output of a luminescent material, such as a scintillator, may be significantly lower as the temperature increases. A temperature sensor may be located within 9 cm, 5 cm, or 0.9 cm of the light source 110. An electronic pulse can be generated by the semiconductor-based photomultiplier 130, and a corresponding digital signal corresponding to the electronic pulse can be adjusted to account for the temperature of the luminescent material. Other light sources that are sensitive to temperature can also be used and have similar adjustments.

In another embodiment, temperature information may be used in conjunction with the methods described herein. For example, a temperature sensor may be located within 9 cm, 5 cm, or 0.9 cm of the semiconductor-based photomultiplier 130. Temperature information from the temperature sensor can be used at least in part for setting the gain reference or bias voltage. For example, the FPGA 224 or memory 226 may have information that correlates temperature and gain reference or bias voltage. Referring to the flow chart in FIG. 3, the branch with setting the gain reference is not performed. Injected pulses, generating derivative information (e.g., integrated charge), determining the revised bias voltage, and adjusting the bias voltage can be performed. In this embodiment, the temperature can be used as a coarse setting for the bias voltage, and the method can be used to as a fine adjustment to the bias voltage.

In a further embodiment, temperature information may be derived from bias voltage. The FPGA 224 or memory 226 may have information that correlates temperature and gain reference or bias voltage. At a particular bias voltage, the temperature can be determined from the correlation. Thus, a temperature change can be determined based at least on part on a comparison of the revised bias voltage to a prior bias voltage. When the light source is close to the semiconductor-based photomultiplier 130, the derived temperature information can be used in determining a compensation factor for light output from the light source. The temperature information may be used for another purpose.

Apparatuses and methods as described herein can be used to help stabilize the gain of a semiconductor-based photomultiplier. As the gain is stabilized, electronic pulses from the semiconductor-based photomultiplier or corresponding digital signals do not need to be adjusted to account for temperature changes that the semiconductor-based photomultiplier experiences during operation of the apparatus. A calibration light source, a temperature sensor, and temperature information are not required to be used for the method. Further, the method used to stabilize the gain can be performed as a background function (not visible to the user) while the apparatus is being used for one or more of its principal functions, such as radiation detection, imaging, ranging, or the like.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the embodiments as listed below.

Embodiment 1

An apparatus comprising a semiconductor-based photomultiplier, the apparatus being configured to: inject a first input pulse into the semiconductor-based photomultiplier; determine a revised bias voltage for the semiconductor-based photomultiplier based at least in part on a first output pulse corresponding to the first input pulse and a second output pulse from the semiconductor-based photomultiplier that is obtained at another time as compared to the first output pulse; and adjust a bias voltage for the semiconductor-based photomultiplier to the revised bias voltage.

Embodiment 2

The apparatus of Embodiment 1, wherein the determination of the revised bias voltage is performed without any temperature information.

Embodiment 3

The apparatus of Embodiment 1 or 2, wherein the apparatus is further configured to analyze a set of bias voltages to monitor or determine a health of the apparatus.

Embodiment 4

The apparatus of any one of Embodiments 1 to 3, wherein the apparatus is further configured to: determine a temperature change based at least on a comparison of the revised bias voltage to a prior bias voltage used during the first input pulse.

Embodiment 5

A method, comprising: providing an apparatus comprising a semiconductor-based photomultiplier; injecting a first input pulse into the semiconductor-based photomultiplier; determining a revised bias voltage for the semiconductor-based photomultiplier based at least in part on a first output pulse corresponding to the first input pulse and a second output pulse from the semiconductor-based photomultiplier that is obtained at another time as compared to the first output pulse; and adjusting a bias voltage for the semiconductor-based photomultiplier to the revised bias voltage.

Embodiment 6

The method of Embodiment 5, wherein determining the revised bias voltage is performed without a calibration light source or any temperature information for the semiconductor-based photomultiplier.

Embodiment 7

The method of Embodiment 5, further comprising integrating the first output pulse over time to obtain a first integrated signal.

Embodiment 8

The method of Embodiment 7, wherein a second integrated signal corresponds to the second output pulse.

Embodiment 9

The method of Embodiment 8, wherein determining the revised bias voltage comprises determining the revised bias voltage that is within 9%, within 5%, or within 1% of $V_{B1}$, wherein: $V_{B1}=V_{B2} N*(S_2-S_1)$ $V_{B1}$ is a bias voltage corresponding to the first output pulse, $V_{B2}$ is a bias voltage corresponding to the second output pulse, N is a conversion factor, $S_1$ is the first integrated signal; and $S_2$ is the second integrated signal.

Embodiment 10

The method of any one of Embodiments 5 to 9, further comprising generating an electronic pulse at the semiconductor-based photomultiplier in response to light received by the semiconductor-based photomultiplier.

Embodiment 11

The method of Embodiment 10, wherein the light is emitted by a luminescent material.

Embodiment 12

The method of Embodiment 10, wherein the light is reflected from an object outside the apparatus.

Embodiment 13

The method of Embodiment 10, wherein the light is received from a light source outside the apparatus.

Embodiment 14

The method of any one of Embodiments 10 to 13, further comprising: obtaining temperature information associated with a light source of the light; and adjusting a digital signal corresponding to the electronic pulse based at least in part on the temperature information.

Embodiment 15

The method of Embodiment 14, wherein the apparatus further comprises a temperature sensor, the method further comprising adjusting the digital signal based at least in part on temperature information from the temperature sensor.

Embodiment 16

The method of any one of Embodiments 10 to 15, further comprising performing further analysis of the electronic pulse received from the semiconductor-based photomultiplier, wherein the light source includes a luminescent material.

Embodiment 17

The method of any one of Embodiments 5 to 16, further comprising injecting another input pulse into the semiconductor-based photomultiplier after injecting the first input pulse, wherein injecting the other input pulse is performed on a predetermined schedule or in response to an occurrence of a predetermined event.

Embodiment 18

The method of any one of Embodiments 5 to 16, further comprising injecting another input pulse into the semiconductor-based photomultiplier wherein injecting the other input pulse is performed in response to input from a human.

Embodiment 19

The method of any one of Embodiments 5 and 7 to 18, further comprising analyzing a set of bias voltages to monitor or determine a health of the apparatus.

Embodiment 20

The method of any one of Embodiments 5 and 7 to 19, further comprising determining a temperature change based at least on a comparison of the revised bias voltage to the bias voltage used during the first input pulse.

Embodiment 21

The apparatus or the method of any one of Embodiments 1 to 20, wherein the semiconductor-based photomultiplier is a Si photomultiplier.

Embodiment 22

The apparatus or the method of any one of Embodiments 1 to 21, wherein: the first input pulse corresponds to a first temperature, and a second input pulse corresponds to a second temperature; the second temperature is in a range of 20° C. to 25° C., and the first temperature is at least 1.1° C. different from the second temperature.

Embodiment 23

The apparatus or the method of any one of Embodiments 1 to 22, wherein the apparatus does not include a calibrating light source.

Embodiment 24

The apparatus or the method of any one of Embodiments 1 to 23, wherein the apparatus further comprising a pulse injection circuit that is configured to inject the first input pulse into the semiconductor-based photomultiplier during normal operation of the apparatus.

Embodiment 25

The apparatus or the method of any one of Embodiments 1 to 24, wherein the apparatus further comprising a bias voltage supply circuit that is configured to provide a bias voltage to the semiconductor-based photomultiplier.

Embodiment 26

The apparatus or the method of any one of Embodiments 1 to 9 and 17 to 25, wherein the apparatus comprises a light source.

Embodiment 27

The apparatus or the method of any one of Embodiments 10 to 16 and 26, further comprising a light adjustment module configured to adjust an electronic signal corresponding to light received by the semiconductor-based photomultiplier.

Embodiment 28

The apparatus or the method of Embodiment 27, wherein the light adjustment module is configured to generate an adjusted light output based at least in part on an actual light output and temperature information from the temperature sensor.

Embodiment 29

The apparatus or the method of any one of Embodiments 26 to 28, wherein: the light source is a luminescent material optically coupled to the semiconductor-based photomultiplier; and the apparatus further comprises a temperature sensor adjacent to an interface between the luminescent material and the semiconductor—

Embodiment 30

The apparatus or the method of Embodiment 29, wherein the luminescent material is configured to emit luminescent light in response to absorbing radiation.

Embodiment 31

The apparatus or the method of any one of Embodiments 1 to 30, wherein the apparatus is at least part of a ranging instrument, a radiation detection apparatus, or a medical imaging apparatus.

Embodiment 32

The apparatus or the method of any one of Embodiments 1, 5, and 7 to 31, wherein temperature information is used as a coarse adjustment for the revised bias voltage, and the first input pulse is used as a fine adjustment for the revised bias voltage.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and apparatuses that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An apparatus comprising a semiconductor-based photomultiplier, the apparatus being configured to:
   inject a first input pulse into the semiconductor-based photomultiplier, wherein injecting the first input pulse increases a magnitude of the first input pulse by one or more steps until the first input pules is pushed above a breakdown threshold at a current operating temperature;
   determine a revised bias voltage for the semiconductor-based photomultiplier based at least in part on a first output pulse corresponding to the first input pulse and a second output pulse from the semiconductor-based photomultiplier that is obtained at another time as compared to the first output pulse; and
   adjust a bias voltage for the semiconductor-based photomultiplier to the revised bias voltage.

2. The apparatus of claim 1, further being configured to determine a temperature change based at least on a comparison of the revised bias voltage to a prior bias voltage used during the first input pulse.

3. The apparatus of claim 1, wherein the one or more steps have an increase in voltage between 2 mV to 500 mV.

4. The apparatus of claim 1, further being configured to generate an output pulse in the form of an electronic pulse that is transmitted by the semiconductor-based photomultiplier.

5. The apparatus of claim 1, further being configured to generate derivative information based at least in part on the output pulse from the semiconductor-based multiplier.

6. The apparatus of claim 1, wherein injecting the first input pulse into the semiconductor-based photomultiplier is performed in response to a predetermined schedule.

7. The apparatus of claim 1, wherein injecting the first input pulse into the semiconductor-based photomultiplier is performed in response to a predetermined event.

8. The apparatus of claim 7, wherein the predetermined event is selected from the group consisting of a reboot, a start-up, a shutdown, a power outage, and any combination therein.

9. A method, comprising:
   providing an apparatus comprising a semiconductor-based photomultiplier;
   setting a first bias voltage to a desired gain;
   supplying the first bias voltage to the semiconductor-based photomultiplier;
   injecting a first input pulse into the semiconductor-based photomultiplier based on the first bias voltage;
   determining a revised bias voltage for the semiconductor-based photomultiplier based at least in part on a first output pulse corresponding to the first input pulse and a second output pulse from the semiconductor-based photomultiplier that is obtained at another time as compared to the first output pulse; and
   adjusting a second bias voltage for the semiconductor-based photomultiplier to the revised bias voltage.

10. The method of claim 9, wherein the biased voltage is between 20 VDC and 30 VDC.

11. The method of claim 9, further comprising determining a temperature change based at least on a comparison of the revised bias voltage to the first bias voltage used during the first input pulse.

12. The method of claim 11, wherein temperature information from a temperature sensor can be used at least in part for setting the first bias voltage.

13. The method of claim 12, wherein the temperature sensor is located within 9 cm of the semiconductor-based photomultiplier.

14. The method of claim 9, wherein the first input pulse corresponds to a first temperature and a second input pulse corresponds to a second temperature, wherein the second temperature is between 20° C. and 25° C., and wherein the first temperature is at least 1.1° C. different from the second temperature.

15. The method of claim 9, wherein the semiconductor-based photomultiplier is between 1° C. and 11° C. away from the temperature of the initial temperature of the first bias voltage.

16. The method of claim 9, further comprising adjusting the revised bias voltage based at least in part on temperature information from a temperature sensor.

17. The method of claim 9, further comprising injecting a second input pulse into the semiconductor-based photomultiplier after injecting the first input pulse, wherein injecting the second input pulse is performed on a predetermined schedule or in response to an occurrence of a predetermined event.

18. A method comprising:

injecting a first input pulse into a semiconductor-based photomultiplier within an apparatus;

determining a revised bias voltage for the semiconductor-based photomultiplier based at least in part on a first output pulse corresponding to the first input pulse and a second output pulse from the semiconductor-based photomultiplier that is obtained at another time as compared to the first output pulse, wherein determining the revised bias voltage comprises determining the revised bias voltage that is within 9% of $V_{B1}$, wherein:

$$V_{B1}=V_{B2}+N*(S_2-S_1)$$

$V_{B1}$ is a bias voltage corresponding to the first output pulse, $V_{B2}$ is a bias voltage corresponding to the second output pulse, N is a conversion factor, $S_1$ is the first integrated signal; and $S_2$ is the second integrated signal; and adjusting a bias voltage for the semiconductor-based photomultiplier to the revised bias voltage.

19. The method of claim 18, wherein adjusting the bias voltage for the semiconductor-based photomultiplier is adjusted after a threshold value is reached.

20. The method of claim 18, wherein the threshold value is greater than 0.1% of $VB_1$.

* * * * *